(12) United States Patent
Gerard et al.

(10) Patent No.: US 8,618,624 B2
(45) Date of Patent: Dec. 31, 2013

(54) UV CURABLE ENCAPSULANT

(75) Inventors: Pierre Gerard, Denguin (FR); Izhar Halahmi, Hod Hasharon (IL); Pasha Solel, Tel Aviv (IL)

(73) Assignees: Arkema France, Colombes (FR); Pythagoras Solar Inc., San Mateo, CA (US)

( * ) Notice: Subject to any disclaimer, the term of this patent is extended or adjusted under 35 U.S.C. 154(b) by 0 days.

(21) Appl. No.: 13/696,174

(22) PCT Filed: May 3, 2010

(86) PCT No.: PCT/IB2010/001802
§ 371 (c)(1),
(2), (4) Date: Nov. 5, 2012

(87) PCT Pub. No.: WO2011/138630
PCT Pub. Date: Nov. 10, 2011

(65) Prior Publication Data
US 2013/0059411 A1    Mar. 7, 2013

(51) Int. Cl.
*H01L 31/0203* (2006.01)
(52) U.S. Cl.
USPC ............ 257/433; 257/436; 257/E31.117; 257/E25.009; 438/56; 438/64; 136/251
(58) Field of Classification Search
USPC ............ 257/433, 436, E31.117, E25.09; 438/56, 64; 136/251
See application file for complete search history.

(56) References Cited

U.S. PATENT DOCUMENTS

| 4,692,557 A | 9/1987 | Samuelson et al. |
| 8,013,062 B2 | 9/2011 | Ruzette et al. |
| 2006/0063891 A1 | 3/2006 | Ruzette et al. |

FOREIGN PATENT DOCUMENTS

| JP | 64-19780 A | 1/1989 |
| WO | 03/062293 A1 | 7/2003 |

OTHER PUBLICATIONS

International Search Report, dated Mar. 17, 2011, issued in corresponding PCT/IB2010/001802.
Written Opinion, dated Mar. 17, 2011, issued in corresponding PCT/IB2010/001802.

*Primary Examiner* — Thanh V Pham
(74) *Attorney, Agent, or Firm* — Millen, White, Zelano & Branigan, P.C.

(57) ABSTRACT

The present invention relates to UV curable encapsulant compositions based on acrylic and/or methacrylic block copolymers, to structures containing these compositions especially photovoltaic cells and to the use of these compositions in photovoltaic cells. The liquid encapsulant composition according to the invention comprises:
  an acrylic or methacrylic block copolymer,
  at least one acrylic or methacrylic monomer and/or oligomer, and
  at least one photo initiator.

13 Claims, 1 Drawing Sheet

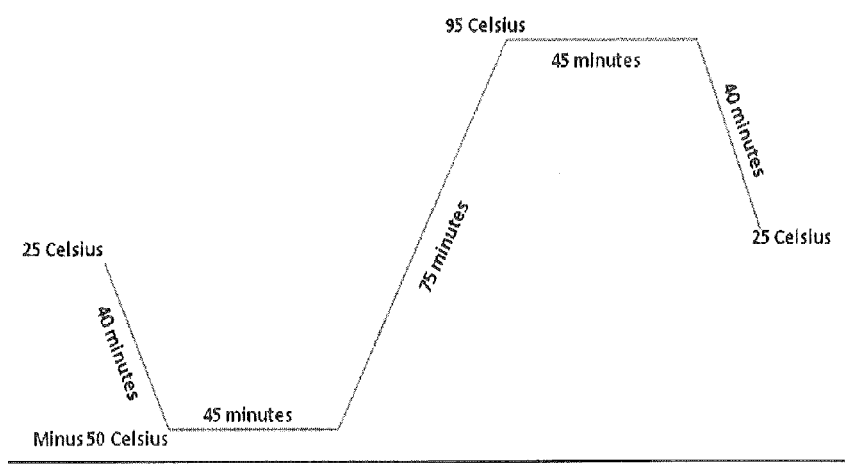

UV CURABLE ENCAPSULANT

FIELD OF THE INVENTION

The present invention relates to UV curable encapsulant compositions based on acrylic and/or methacrylic block copolymers, to a material made therefrom and to the use of these compositions in photovoltaic cells.

BACKGROUND OF THE INVENTION

Global warming, linked to the greenhouse gases released by fossil fuels, has incited to develop alternative energy solutions, which do not emit such gases during their operation, such as, for example, solar modules. A solar module comprises a "photovoltaic cell", this cell being capable of converting light energy into electricity. Photovoltaic (PV) cells are encased in an "encapsulant", and an upper protective layer and a lower protective layer are positioned on both sides of the encapsulated cell. The encapsulant must perfectly take up the shape of the space existing between the photovoltaic cell and the protective layers in order to avoid the presence of air, which would limit the output of the solar module. The encapsulant must also prevent the contact of the cells with water and oxygen from the air, in order to limit the corrosion thereof. Moreover, the encapsulant must offer optimal and durable transparency to the solar radiation and a good adhesion with the protective layers inside the cell, and this during the entire life of a solar module, which has to be at least of 20 years. As PV cells become thinner, the stress generated by encapsulant, especially at low temperatures, needs to be low. The modulus of elasticity of said encapsulant, needs thus to be as low as possible.

The most prevalent solution is the use of encapsulant compositions based on ethylene/vinyl acetate copolymer (EVA) as disclosed in JP 1019780. EVA has good transparency properties. However, its adhesion to the protective layers is not satisfactory and coupling agents have to be added to the encapsulant composition, generally chosen between organic silane or titanate. Moreover, EVA decomposes under solar radiation and at high temperature, resulting in acetic acid release that corrodes the inside of the photovoltaic cell. EVA-based encapsulant compositions tend to turn yellow in time, thus lowering the yield of the solar module. Also, EVA has poor adhesion to transparent plastics, such as polymethyl methacrylate (PMMA), used in concentrating photovoltaic (CPV) devices.

It has already been generally suggested (PCT/IL 2009/001064) to use light curable liquid encapsulant formulations comprising: at least one acrylic polymer (defined as a polymer having at least 50% of its chains made of repeating units derived from acrylic and/or methacrylic acid, ester or amide thereof); at least one unsaturated monomer and/or oligomer and at least one photoinitiator. This encapsulant is capable of bonding to a transparent amorphous surface, and thus it is suitable to encapsulate a photovoltaic cell, especially for CPV applications.

Commercially available acrylic (or methacrylic) polymers such as Elvacite™, manufactured by Lucite, provide the encapsulant with reasonable adhesion to plastics, especially PMMA, but not excellent. When these polymers have a glass transition temperature (Tg) greater than 0° C., large amount of plasticizer are required to lower the Tg and the modulus of elasticity. The plasticizer is subjected to migration from compound during service, and also may phase-separate at sub-zero temperatures, causing undesired haze. Usually, plasticizers, even of aliphatic chain type, are more subjected to thermal degradation than acrylate and methacrylate polymers. Moreover, said polymers have limited compatibility with unsaturated monomers and thus tend to haze during photo-curing.

There is thus a need to develop new encapsulant materials for photovoltaic applications, with improved properties especially in terms of adherence, transparency, low glass transition temperature and durability.

SUMMARY OF THE INVENTION

The aim of the present invention is to provide an improved light curable liquid encapsulant for photovoltaic (PV) cells that has excellent qualities of transparency, adhesion especially to plastic surfaces such as PMMA or polycarbonate and resistance to ageing under UV radiation.

It is one object of the present invention to provide a liquid encapsulant composition comprising:
- an acrylic or methacrylic block copolymer,
- at least one acrylic or methacrylic monomer and/or oligomer, and
- at least one photo initiator.

wherein said acrylic or methacrylic block copolymer is of the general formula B-(A)n, wherein:
- n is a natural integer greater than or equal to 1,
- B represents an acrylic or methacrylic polymer block composed of a sequence of monomer units which may be polymerized by the radical route, the overall Tg of which is less than 0° C., wherein the average molar mass of the block B is preferably greater than 1000 g/mol,
- A is an acrylic or methacrylic polymer block composed of a sequence of monomer units which may be polymerized by the radical route, the overall Tg of which is greater than 0° C., wherein the average molar mass of each block A preferably ranges from 1000 g/mol to 200000 g/mol,
- block B represents at least 50% and preferably from 60% to 95% w/w of the block copolymer.

Surprisingly, this encapsulant composition combines, when cured by UV-curing, UV-Visible curing or visible light curing, excellent properties of: transparency (which remains constant in time and for a broad temperature range going from ambient temperature up to 80° C.), resistance to ageing under UV radiation and heat, electrical isolation—even under damp environment, water and oxygen barrier, elasticity even at low temperatures, adherence to metals, glass, plastics and ceramics, which recommend its use in the solar modules.

According to a second object, the present invention concerns the use of acrylic or methacrylic block copolymers, as defined herein, into encapsulant compositions, thus improving the encapsulant adhesion to substrates such as plastics, ceramics, metals or glass.

According to a further aspect, the present invention concerns the use of the cited encapsulant composition for bonding and encapsulation of PMMA- or polycarbonate- or cyclic-based PV devices, and especially concentrated PV devices.

According to a further aspect, the present invention concerns the use of the cited encapsulant composition for bonding and encapsulation of regular PV cells (silicon PV cell, encapsulated between transparent glass or polymeric front sheet and glass or metal or polymeric back sheet), as an alternative to thermoplastic encapsulants such as EVA (ethylene/vinyl acetate), PVB (polyvinyl butyral), polyurethane or ionomer which require high pressure and high temperature during lamination and long time curing or molding.

According to another aspect, this invention provides a process for encapsulating PV cells, comprising a step of UV-curing, UV-Visible or visible light curing the encapsulant composition.

According to a further aspect, the present invention concerns the material obtained by UV-curing, UV-Visible curing or visible light curing of the above-cited encapsulant composition.

DETAILED DESCRIPTION OF THE INVENTION

The liquid encapsulant composition of the invention comprises an acrylic or methacrylic block copolymer, as defined herein, at least one acrylic or methacrylic monomer and/or oligomer, and at least one photo initiator.

Liquid encapsulant formulations comprising at least one acrylic polymer, at least one unsaturated monomer and/or oligomer and at least one photoinitiator are already known, as indicated above. The Applicant has found that when:
  the acrylic polymer is an acrylic or methacrylic block copolymer of the general formula the general formula B-(A)n, as defined below, and
  the unsaturated monomer or oligomer is an acrylic or methacrylic monomer, the adhesion properties of the encapsulant composition to substrates such as plastics, are greatly improved.

A special embodiment is adhesion to PMMA, which is very useful in CPV solar modules.

The acrylic or methacrylic block copolymers of the invention fall under the general formula:

B-(A)n, in which:
  n is a natural integer greater than or equal to 1, preferably from 1 to 8,
  B represents an acrylic or methacrylic polymer block composed of a sequence of monomer units which can be polymerized by the radical route, the overall Tg of which is less than 0° C. The average molar mass of the block B may be greater than 1000 g/mol, preferably greater than 5000 g/mol and more preferably greater than 10,000 g/mol,
  A is an acrylic or methacrylic polymer block composed of a sequence of monomer units which can be polymerized by the radical route, the overall Tg of which is greater than 0° C. The average molar mass of each block A may range from 1000 g/mol to 200000 g/mol, preferably from 2000 g/mol to 100000 g/mol and more preferably from 5000 to 50000 g/mo.

The relative lengths of the blocks A and B are chosen so that the ratio n*Mn(B)/(n*Mn(A)+Mn(B)) is from 0.5 to 0.95, preferably from 0.6 to 0.8, and such as Mn(B) is greater or equal to the mean entanglement length of the block B, where Mn designates the average molecular mass of the polymer; the symbol "*" is used to designate a multiplication operation.

The block copolymer presents an index of polydispersity Ip from 1.1 to 3, advantageously from 1.3 to 2.5 and preferably from 1.5 to 2. The block B presents an Ip of less than 1.5.

Generally, the block B represents at least 50% w/w of the block copolymer, and preferably from 50% to 95%. Particularly, B is a polyacrylate or a polymethacrylate with a Tg of less than 0° C. In this case, B contains repeating units of alkyl acrylate or methacrylate, preferably $C_1$—$C_8$ alkyl(meth) acrylates such as butyl acrylate, hexyl acrylate, ethylhexylacrylate, octyl acrylate; ethoxylated acrylates such as 2-(2-ethoxyethoxy)ethyl acrylate (EOEOEA); $C_{16}$—$C_{18}$ alkyl methacrylate; and polypropylene glycol monomethacrylate.

Tg designates the glass transition temperature of a polymer measured by DSC (differential scanning calorimetry) according to the standard ASTM E1356, for example, with temperature increase slopes of 20° C. per minute.

Block A is preferably selected from among the methacrylates with a Tg of greater than 0° C. Preferably, A contains repeating units of methyl methacrylate. Block A may contain non-converted monomers present in the reaction medium after the synthesis of block B.

The block copolymers of the invention are prepared in a manner known from example from document WO 03/062293, by controlled radical polymerization.

In a first step, the block B is prepared by mixing the monomer(s) with at least one monofunctional alkoxyamine of formula (I) below:

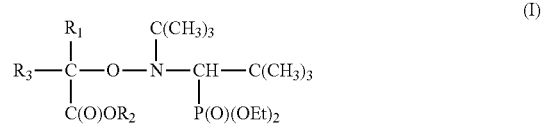

in which:
  R1 and R3, identical or different, represent an alkyl group, linear or branched, with a number of carbon atoms from 1 to 3;
  R2 represents a hydrogen atom; an alkyl group, linear or branched, with a number of carbon atoms from 1 to 8; a phenyl group; an alkaline metal such as Li, Na, K; an ammonium ion such as $NH_4^+$, $NHBu_3^+$; preferably, R1 is CH3 and R2 is H;
and/or at least one polyfunctional alkoxyamine of formula (II):

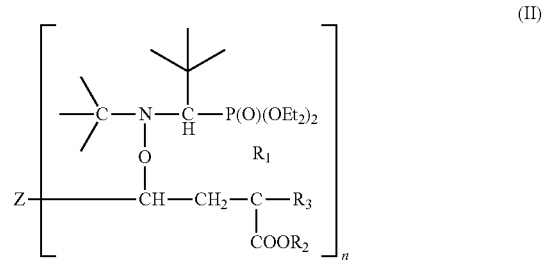

in which:
  R1, R2 and R3 are defined above;
  Z represents an aryl group or a group of formula $Z_1$—[X—C(O)]$_n$, in which $Z_1$ represents a polyfunctional structure originating, for example, in a compound of the polyol type, X is selected among: an oxygen atom, a nitrogen atom carrying a carbon group or a hydrogen atom and a sulfur atom, and
  n is a natural integer greater than or equal to 2.

Polymerization of block B is performed at temperatures ranging from 60 to 250° C., preferably from 90 to 160° C., and at pressures from 0.1 to 80 bar, preferably from 0.5 to 10 bar. The polymerization has to be controlled, and it is stopped before 99% conversion, preferably before 90% conversion of the monomer(s). The block B thus obtained is either used with the residual monomers or is purified from the monomers by distillation or washing and drying with a solvent which is not miscible with B and which is miscible with the monomers used.

In a second step, the block B thus prepared is diluted in the mixture of monomers intended to form the block(s) A. Polymerization of block A is performed at temperatures ranging from 60 to 250° C., preferably from 90 to 160° C., and at pressures from 0.1 to 80 bar, preferably from 0.5 to 10 bar.

The mass conversion of the monomer varies from 10 to 100% and the block copolymer obtained is separated from the residual monomers by evaporation under vacuum at temperatures up to 250° C. and preferably up to 200° C.

The liquid encapsulant composition of the invention comprises also at least one acrylic or methacrylic monomer and/or oligomer. Preferably, said acrylic or methacrylic monomer and/or oligomer is an alkyl acrylate or an alkyl methacrylate, the term "alkyl" being defined herein as a chain comprising C, H, O and/or N atoms that comprises no conjugated double bonds between adjacent carbon atoms and no aromatic group.

The acrylic or methacrylic monomer and/or oligomer entering the liquid encapsulant composition according to the invention has a Tg of less than 0° C. and presents a good miscibility, measured by the solubility parameter, with the acrylic or methacrylic block copolymer described above.

The acrylic or methacrylic monomer and/or oligomer is chosen for example in the following list: ethoxylated acrylates such as 2-(2-ethoxyethoxy)ethyl acrylate (EOEOEA), polypropylene glycol monomethacrylate, triethylene glycol diacrylate (TEGDA), tripropylene glycol diacrylate (TPGDA), alkoxylated diacrylate, propoxylated 2-neopentyl glycol diacrylate, pentaerythritol tetraacrylate (PETTA), ethoxylated trimethylolpropane triacrylate and cyclic trimethylolpropane formal acrylate (CTFA).

In one embodiment (called embodiment Y), the acrylic or methacrylic monomer and/or oligomer entering the liquid encapsulant composition according to the invention has, in addition to a Tg of less than 0° C. and a good compatibility with the acrylic or methacrylic block copolymer, a good solvency towards PMMA. Examples of such monomers or oligomers are: hydroxy ethyl methacrylate, hydroxy propyl methacrylate, tetrahydrofurfuryl acrylate or methacrylate and methyl methacrylate.

The liquid encapsulant composition of the invention comprises also at least one photo initiator, preferrably one that does not yellow outdoors, for example:
2-Hydroxy-2-methyl-1-phenyl-propan-1-one (known as Darocur 1173 by Ciba),
1-Hydroxy-cyclohexyl-phenyl-ketone (known as Irgacure 184 by Ciba),
Bis(2,4,6-trimethylbenzoyl)-phenylphosphineoxide (known as Irgacure 819 by Ciba).

Optionally, a plasticizer compatible with the block copolymer and with the acrylic or methacrylic monomer and/or oligomer is added to the liquid encapsulant composition of the invention. Said plasticizer has an aliphatic backbone that provides it with good resistance to UV light degradation. Examples are aliphatic esters of long alkyl alcohols, or esters of aliphatic mono- or dicarboxylic, saturated or unsaturated acids, for example adipic acid mono and di-esters, azelaic acid mono and di-esters, glutaric acid mono and di-esters, maleic acid mono and di-esters, sebacic acid mono and di-esters and esters of polyethylene and polypropylene glycol.

The liquid encapsulant composition of the invention comprises in weight:
from 10 to 80% of the acrylic or methacrylic block copolymer described above, preferably from 20% to 80% and more preferably from 30% to 70%;
from 10% to 60% of the acrylic or methacrylic monomer and/or oligomer described above, preferably from 20% to 80% and more preferably from 30% to 70%;
from 0.1 to 10% of photo-initiator;
from 0 to 50% of plasticizer, preferably from 1% to 40% and more preferably from 5% to 30%,
based on the total weight of the composition.

Optionally, an adhesion promoter such as vinyl silane, methacryloxy or acryloxy silane, organo-titanate and organo zirconate can be added to the encapsulant composition especially in the embodiment Y. When present, said adhesion promoter represents up to 20% in weight of the encapsulant composition.

The cured composition is flexible and soft, very hydrophobic, UV light resistant, transparent and unlike EVA and ionomer, contains low levels of acidic groups or free acid.

The encapsulant composition according to the present invention presents before curing a viscosity ranging from 100 to 100000 centipoises (0.1 to 100 Pascal.s), preferably from 500 to 10000 centipoises, and a light transmission of at least 94% (for a thickness of 500 micrometers).

The encapsulant composition according to the present invention is very useful for bonding and encapsulation of PMMA- or Polycarbonate or cyclic olefin-based PV devices, and especially concentrated PV (CPV devices). Examples for useful designs suitable for encapsulation with this composition are low and high concentration PV (CPV), building integrated PV (BIPV), and PV modules having PMMA front sheet.

The encapsulant composition according to embodiment Y is especially useful for bonding and encapsulation of regular PV cells (silicon PV cell, encapsulated between transparent glass or polymeric front sheet and glass or metal or polymeric back sheet), as alternative to thermoplastic encapsulants such as EVA, PVB, polyurethane or ionomer. Such encapsulant is designed for a PV module comprising glass or polymeric transparent front sheet, encapsulant, PV cell, encapsulant and metal or metallic plastic or plastic or glass back sheet.

The novel liquid encapsulant according to the present invention, comprising an acrylic or methacrylic block copolymer as defined above, adheres very well to PMMA and generally to plastic and metal substrates.

The term "adhere" refers to the adhesion of photo-cured composition according the present invention comprising the block copolymer, at least one acrylic or methacrylic monomer and/or oligomer and at least one photo initiator, to a substrate, especially of PMMA. The adhesion is measured by two independent methods:
adhesion of the cured film from the PMMA substrate. Good adhesion refers to a peel force of greater than 100 gr/25 mm, at 23° C. according to ASTM D3330.
bonding a 100 mm long, 5 mm thick and 2 mm wide PMMA (injection molding grade) to a glass plate of the same dimensions. Adhesive thickness should be 300-500 micrometers. After curing (by exposure to UV or UV-visible light sufficient for obtaining a non tacky film), the assembly is exposed to thermal cycles (100 cycles, 500 cycles and 1000 cycles according to temperature profile provided in annexed FIG. 1). Good adhesion refers to a bubble-free, delamination-free and crack-free assembly.

BRIEF DESCRIPTION OF THE DRAWING

FIG. 1 represents a thermal cycle profile used in testing adhesives of the invention.

The following example illustrates the present invention in a non-limiting manner.

EXAMPLE

A comparative adhesion study, between a composition according to the present invention and a composition including a known-in-the-art acrylic polymer, was performed in consistence with the conditions given in Table 1 below (all percentages are in weight):

TABLE 1

| Formula | Polymer name | EOEOEA | HPA | Photo Initiator |
|---|---|---|---|---|
| Example according to the current invention | Arkema DC 228 25% | 55% | 19% | LTM 1% |
| Example based on off-the-shelf acrylic polymer | Elvacite 2044 25% | 55% | 19% | LTM 1% |

Arkema DC 228 is a AB type diblock copolymer, the bloc B being made of polybutyl acrylate or PBA (Tg of −45° C., measured by DSC) and A being made of polymethyl methacrylate or PMMA (Tg of 110° C. measured by DSC) synthesized following the procedure described in the patent WO 03/062293, having a weight composition of 55% of PBA and 45% of PMMA. The molar mass of the diblock copolymer in number is 24430 g/mol and the molar mass by weight is 41410 g/mol. The polydispersity index is 1.7.

Elvacite 2044 is a high molecular weight n-butyl methacrylate polymer, manufactured by Lucite. The polymer has a Tg of 20° C., and 300% elongation at break.
HPA is hydroxy propyl methacrylate monomer. EOEOEA is 2-(2-ethoxyethoxy)ethyl acrylate. LTM is GENOCURE LTM liquid photo initiator blend manufactured by Rahn.

The compositions were mixed in dark glass bottle at ambient temperature, then applied between plates of 50 mm long, 5 mm thick and 2 mm wide PMMA (injection molding grade) to same dimensions glass plate, 4 mm thick. Adhesive thickness was 300 micrometers. Exposing to light from medium pressure mercury lamp for 60 seconds provided the curing. After curing, the assembly was exposed to thermal cycles (100 cycles, 500 cycles and 1000 cycles according to temperature profile provided in FIG. 1). The results are provided in Table 2:

TABLE 2

| Composition | After 100 cycles | After 500 cycles | After 1000 cycles |
|---|---|---|---|
| Arkema DC 228 based | No bubbles, no cracks, no delaminations, clear | No bubbles, no cracks, no delaminations, clear | No bubbles, no cracks, no delaminations, clear |
| Elvacite 2044 based | No bubbles, no cracks, some delaminations, clear | some bubbles, no cracks, more delaminations, slight haze | more bubbles, some cracks, severe delaminations, slight haze |

These results show that the encapsulant composition based on a block copolymer according to the invention, exhibits after curing a better adhesion to a PMMA substrate and resistance to thermal cycling and phase separation, than a similar encapsulant composition based on a non-block acrylic polymer.

The invention claimed is:
1. A liquid encapsulant composition comprising:

an acrylic or methacrylic block copolymer, of the general formula:

B-(A)n, in which:
n is a natural integer greater than or equal to 1,
B represents an acrylic or methacrylic polymer block composed of a sequence of monomer units which can be polymerized by the radical route, the overall Tg of which is less than 0° C.,
A is an acrylic or methacrylic polymer block composed of a sequence of monomer units which can be polymerized by the radical route, the overall Tg of which is greater than 0° C.,
block B represents at least 50% w/w of the block copolymer,
at least one acrylic or methacrylic monomer and/or oligomer, and
at least one photoinitiator.
2. Composition according to claim 1 comprising in weight:
from 10 to 90% of said acrylic or methacrylic block copolymer;
from 10% to 60% of said acrylic or methacrylic monomer and/or oligomer
from 0.1 to 10% of photo-initiator,
based on the total weight of the composition.
3. Composition according to claim 1 in which the block B contains repeating units of alkyl acrylate or methacrylate selected in the group consisting of: butyl acrylate, hexyl acrylate, octyl acrylate, ethoxylated acrylates, $C_{16}$—$C_{18}$ alkyl methacrylate, and polypropylene glycol monomethacrylate.
4. Composition according to claim 1 in which the block A contains repeating units of methyl methacrylate.
5. Composition according to claim 1 in which said acrylic or methacrylic monomer and/or oligomer is an alkyl acrylate or an alkyl methacrylate having a Tg of less than 0° C. chosen in the group consisting of: ethoxylated acrylates, polypropylene glycol monomethacrylate, triethylene glycol diacrylate (TEGDA), tripropylene glycol diacrylate (TPGDA), alkoxylated diacrylate, propoxylated 2-neopentyl glycol diacrylate, pentaerythritol tetraacrylate (PETTA), ethoxylated trimethylolpropane triacrylate and cyclic trimethylolpropane formal acrylate (CTFA).
6. Composition according to claim 1 in which said acrylic or methacrylic monomer and/or oligomer is an alkyl acrylate or an alkyl methacrylate having a Tg of less than 0° C. and is chosen in the group consisting of: hydroxy ethyl methacrylate, hydroxy propyl methacrylate, tetrahydrofurfuryl acrylate or methacrylate and methyl methacrylate.
7. Composition according to claim 1 further comprising from 0 to 50% of plasticizer.
8. Composition according to claim 1 further comprising from 0 to 20% in weight of an adhesion promoter selected in the group consisting of: vinyl silane, methacryloxy or acryloxy silane, organo-titanate and organo zirconate.
9. Material obtained by UV-curing, UV-Visible curing or visible light curing of the liquid encapsulant composition according to claim 1.
10. A method for improving adhesion of encapsulant compositions to substrates comprising providing acrylic or methacrylic block copolymers according to claim 1 within the encapsulant compositions.
11. Process for encapsulating PV cells, comprising a step of UV-curing, UV-Visible curing or visible light curing the liquid encapsulant composition according to claim 1.

12. A method for encapsulating PMMA- or Polycarbonate or cyclic olefin-based PV devices, comprising applying the encapsulant composition according to claim 5 to said devices.

13. A method for encapsulating silicon PV cells between transparent glass or polymeric front sheet and glass or metal or polymeric backsheet, comprising applying the encapsulant composition according to claim 6 to said cells.

* * * * *